(12) United States Patent
Kirkpatrick

(10) Patent No.: US 6,660,340 B1
(45) Date of Patent: Dec. 9, 2003

(54) DIAMOND-LIKE CARBON FILM WITH ENHANCED ADHESION

(75) Inventor: Sean R. Kirkpatrick, Littleton, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/717,182

(22) Filed: Nov. 21, 2000

Related U.S. Application Data

(60) Provisional application No. 60/180,916, filed on Feb. 8, 2000.

(51) Int. Cl.[7] .......................... C23C 14/48; C23C 14/06; C23C 14/24; C23C 14/02
(52) U.S. Cl. ...................... 427/530; 427/523; 427/525; 427/528
(58) Field of Search ................................ 427/530, 523, 427/528, 525; 118/723 FI

(56) References Cited

U.S. PATENT DOCUMENTS

| | | | |
|---|---|---|---|
| 4,822,466 A | 4/1989 | Rabalais et al. | 204/192.15 |
| 5,064,682 A | 11/1991 | Kiyama et al. | 427/38 |
| 5,393,572 A | 2/1995 | Dearnaley | 427/523 |
| 5,458,927 A | 10/1995 | Malaczynski et al. | 427/527 |
| 5,593,719 A | 1/1997 | Dearnaley et al. | 427/2.26 |
| 5,605,714 A | 2/1997 | Dearnaley et al. | 427/2.24 |
| 5,616,179 A | 4/1997 | Baldwin et al. | 117/108 |
| 5,725,573 A | 3/1998 | Dearnaley et al. | 623/2 |
| 5,780,119 A | 7/1998 | Dearnaley et al. | 427/528 |
| 5,922,415 A | 7/1999 | Dearnaley et al. | 427/490 |
| 6,261,693 B1 * | 7/2001 | Veerasamy | 428/408 |
| 6,338,901 B1 * | 1/2002 | Veerasamy | 428/408 |
| 6,392,244 B1 * | 5/2002 | Grannen et al. | 427/523 |
| 6,416,820 B1 * | 7/2002 | Yamada et al. | 427/530 |
| 6,475,573 B1 * | 11/2002 | Veerasamy et al. | 427/523 |

FOREIGN PATENT DOCUMENTS

| | | |
|---|---|---|
| EP | 0731190 A1 | 11/1996 |
| JP | 406184738 A | 7/1994 |

OTHER PUBLICATIONS

John Baglin; "Interface Structure and Thin Film Adhesion", (1989), no month, Chapter 14 of Handbook of Ion Beam Processing Technology Principles, Deposition, Film Modification and Synthesis, edited by J. Cuomo et al., Noyes Publication, Park Ridge, N.J.

* cited by examiner

Primary Examiner—Marianne Padgett
(74) Attorney, Agent, or Firm—Perkins Smith & Cohen LLP; Jerry Cohen; Jacob N. Erlich

(57) ABSTRACT

A method and apparatus for enhancing the adhesion of a diamond-like carbon (DLC) film to a substrate and for producing a strongly adhered DLC film on a substrate. The adhesion is enhanced by ion beam pre-processing of the substrate prior to DLC film formation.

32 Claims, 5 Drawing Sheets

DIAMOND-LIKE CARBON FILM WITH ENHANCED ADHESION

CROSS REFERENCE TO RELATED APPLICATIONS

This application claims priority of the U.S. Provisional Application Ser. No. 60/180,916 filed Feb. 8, 2000 entitled DIAMOND-LIKE CARBON FILM WITH ENHANCED ADHESION.

BACKGROUND OF THE INVENTION

This invention relates generally to a method for enhancing the adhesion of a diamond-like carbon (DLC) film to a substrate and for producing a strongly adhered DLC film on a metallic substrate or a metallic substrate having an oxide film on the surface and, more particularly, to cases where the substrate intended to receive the DLC film comprises a metal or metal alloy that does not readily form carbides or a metal or metal alloy that may form carbides, but has an oxide coating that does not readily form bonds with carbon. The invention causes strongly adhered DLC films on such metallic substrates or oxide films.

In order to improve the wear resistance or other properties of the surfaces of various substrates, it is desirable to overlay the substrate with a film of a harder material such as diamond-like carbon (DLC). Since the one of the goals in applying a hard DLC film on a substrate is to improve durability and lifetime, it is important that the hard DLC film be strongly adherent to the substrate so that it does not prematurely separate from it.

Of course, it is recognized that these concerns occur in many fields of application where it is desirable to improve adhesion of DLC films to metallic substrates or metallic films that have been deposited on other substrates, and especially so in cases where the substrate metal does not easily adhere to deposited DLC because it does not readily form strong carbide bonds at low temperatures, such as chromium, cobalt, nickel, copper, and alloys thereof or predominately thereof. An example is a magnetic data storage disk substrate having a chromium or copper film surface on which it is desired to deposit a durable DLC protective film coating. Another case is titanium or an alloy consisting primarily of titanium, but having an oxidized surface layer, which may be a native oxide layer. Although titanium may form carbide bonds, the oxide surface layer does not readily form strong carbide bonds at low temperatures and thus strongly adhered DLC films are not readily formed.

One of the problems encountered is that the DLC, when applied by conventional methods like chemical vapor deposition (CVD), physical vapor deposition (PVD), pulsed laser deposition (PLD), conventional ion beam assisted deposition (IBAD), or gas cluster ion beam assisted deposition (GCIBAD), does not produce DLC films that are sufficiently strongly adherent to the substrate metals and which therefore do not have long life and high wear resistance. Conventional methods investigated for improving the poor adhesion of a film include ion beam interface stitching, substrate pre-sputtering, post deposition interface ion implantation, and ion beam assisted deposition. These methods are all described by J. Baglin, in "Interface structure and thin film adhesion", in *Handbook of Ion Beam Processing Technology -Principles, Deposition, Film Modification and Synthesis*, edited by J. Cuomo et. al., Noyes Publications, Park Ridge, N. J. (1989).

Furthermore, interface stitching and post-deposition interface ion implantation both require the ion beams employed be of sufficient energy to completely penetrate the deposited DLC film. This imposes thickness limitations on the DLC films due to the practical unavailability of ion beams of arbitrarily high energies. Other, more complex, treatments involve forming one or ore intermediate layers between the substrate metal and the DLC film of, for example, silicon (taught in U.S. Pat. No. 5,593,719, G. Dearnaly et. al., "Treatments to reduce frictional wear between components made of ultra-high molecular weight polyethylene and metal alloys", 1997) or germanium (taught in U.S. Pat. No. 5,780, 119, G. Dearnaly et. al., "Treatments to reduce frictional wear on metal alloy components" 1998) or a silicon compound or the like (as taught in U.S. Pat. No. 5,605,714, G. Dearnaly et. al., "Treatments to reduce thrombogeneticity in heart valves made from titanium and its alloys" 1997). In the prior art, when an oxide film covers a metal or metal alloy that otherwise might form carbide bonds, steps were required to remove the oxide film prior to DLC deposition and such steps often require the application of high temperatures (as also taught in U.S. Pat. No. 5,605,714, G. Dearnaly et. al., "Treatments to reduce thrombogeneticity in heart valves made from titanium and its alloys" 1997).

Such treatments, however, are complex and time consuming and thus, costly. Also, processes that employ additional materials such as silicon, germanium, or the like introduce foreign materials (Si, Ge, etc) which may detract from the suitability of the resulting structure for some applications. Furthermore, some of the existing processes require heating of the substrates and films during portions of the process, which allows the possibility of thermal degradation of materials or that differing thermal coefficients of expansion between substrate and film result in the introduction of stresses into the film when the materials are returned to room temperature.

In the example of a magnetic storage disk, there may be multiple stacked films of differing materials on the disk's base substrate. In such case, it is desirable to be able to deposit a DLC protective film without subjecting the disk to large temperature excursions that may produce undesirable results due to the different temperature coefficients of expansion of the various layers.

It is therefore an object of this invention to provide a method and system for producing a strongly adhered DLC coating for metals and metal alloys.

It is a further object of this invention to provide a method for causing improved adhesion of a DLC film to a substrate that does not readily form carbide bonds at low temperatures.

It is an additional object of this invention to provide DLC coating and improved DLC film adhesion by a process that is less costly than previous methods.

It is a further object of this invention to provide DLC coating and improved DLC film adhesion by a process that does not require high processing temperatures.

It is an additional object of this invention to provide a DLC film coating on metal or metal oxide substrates without introducing foreign materials.

SUMMARY OF THE INVENTION

The objects set forth above as well as further and other objects and advantages of the present invention are achieved by the embodiments of the invention described hereinbelow.

A substrate, being comprised of a metal or metal alloy that does not readily form carbides (for example chromium, cobalt, nickel, copper, and alloys thereof or predominately thereof) or a metal or metal alloy that may form carbides but is coated with an oxide coating that does not readily form bonds with carbon (for example titanium or an alloy consisting primarily of titanium, but having an oxidized surface layer) receives an ordinary solvent or chemical or other cleaning to assure surface cleanliness. It is then subjected to a pre-deposition adhesion enhancement process that includes the procedure of ion implantation of the surface of the metal substrate to which the DLC film will be deposited with carbon ions at a dose and energy sufficient to establish a volume concentration of carbon atoms at and near the surface of the substrate of not less than $5\times10^{18}$ atoms/cm$^3$, and preferably of more than $4\times10^{19}$ atoms/cm$^3$. Although the implantation energy is not critical, a preferred method is to implant the carbon ions at an energy of from 25 keV to 100 keV. The implantation may be done at room temperature or somewhat above room temperature as may result naturally from slight heating resulting from the implantation, with or without active cooling of the substrate. The carbon implantation is preferably done on an ion implanter that has mass analysis to select $^{12}C$ and reject other ion species—this assures that only pure carbon is introduced to the substrate being processed, thus avoiding the introduction of materials other than the carbon which forms the DLC that will be subsequently applied.

Although implantation of carbon is part of the present invention, the use of the $^{12}C$ isotope of carbon is not essential. $^{13}C$ or a mixture of $^{12}C$ and $^{13}C$ or a natural abundance mixture of carbon isotopes is acceptable. $^{12}C$ is preferred, however, if a single isotope is used, because of its high natural abundance. Many carbon-bearing compounds can serve as the source of carbon ions and the selection of the source material is somewhat dependent on the ion source employed, but in the case of the ion implantation tool I have used with this invention, it has been convenient to use a gaseous source. CO, $CO_2$, and methane are examples of suitable gaseous source materials. CO is preferred because of its high atomic percentage of carbon, which results in an improved carbon ion yield in many ion sources.

It is acceptable for the implantation to be performed with the substrate at temperatures between 0 and 300° C. If it is desired or advantageous that the substrate be maintained at temperatures below a limiting temperature during processing, this may be accomplished by traditional methods such as heat sinking the substrate to a sufficient thermal mass to limit heating, by active cooling of the substrate by conduction through a cooled holder, or by limiting the implantion beam current to a maximum that will assure the temperature of the workpiece (substrate) does not exceed the limit temperature, for example 50° C. The implantation energy is in the range of from 200 eV to 200 keV, with a preferred energy range being 25 to 100 keV. The implantation process imbeds carbon atoms into the subsurface region of the substrate so that carbon-carbon bonds may form between the substrate and the subsequently deposited DLC film, thus improving the adhesion over that which occurs without the preprocessing. Also, the substrate surface is roughened by the radiation damage induced by the implantation, which roughness additionally improves the adhesion of the subsequently deposited DLC film.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
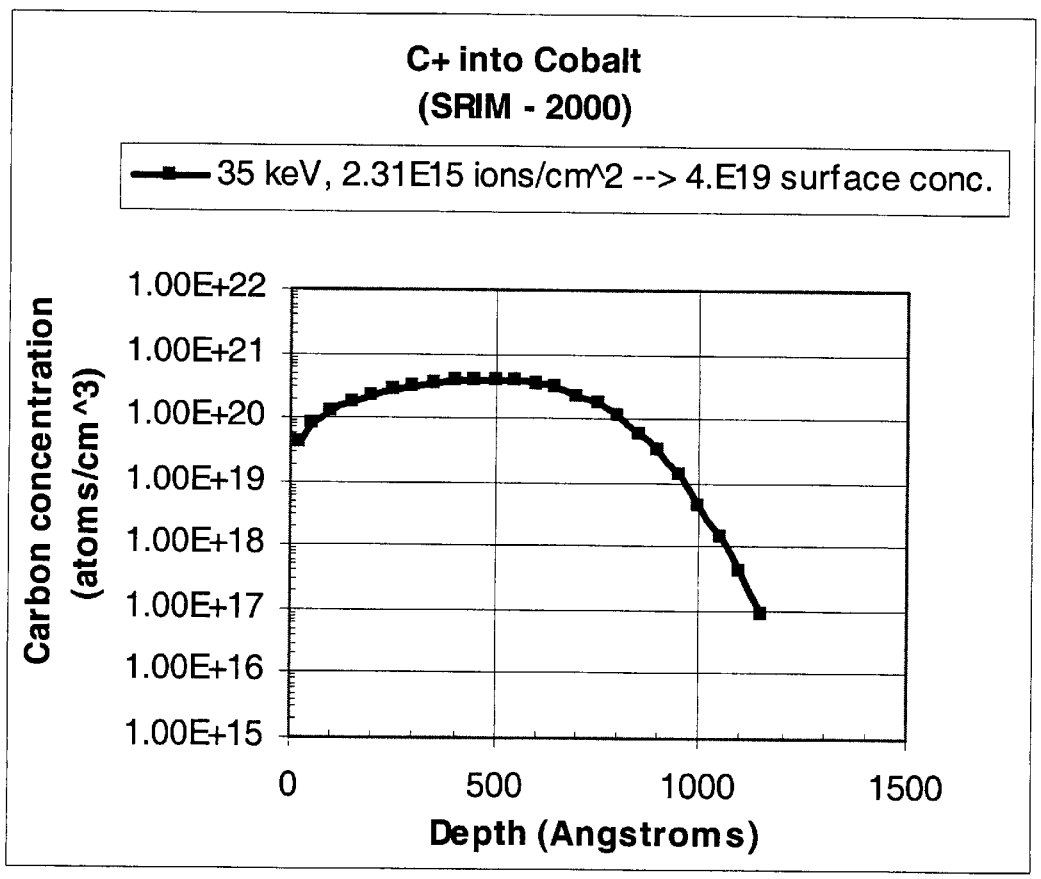
FIG. 1 is a plot of the carbon concentration depth profile estimated by TRIM for a carbon implantation into cobalt metal.

Prior to describing the present invention, it should be understood that implantation dose is commonly specified in terms of the ion fluence (ions/cm$^2$) delivered to the implanted surface rather than in terms of the less easily measured concentration (atoms/cm$^3$) resulting in the implanted substrate. For purposes of this invention it is required that at least $5\times10^{18}$ carbon atoms/cm$^3$ (and preferably more than $4\times10^{19}$ carbon atoms/cm$^3$) be introduced into the shallow subsurface of the substrate. In order to determine the correct carbon dose to be implanted to achieve the desired surface concentration of carbon, the following two methods are examples of the type of methodology that can be used with the present invention.

A first method is to perform a test implantation and then measure the resulting concentration of carbon atoms near the surface. If the measured concentration is too high or too low, the implantation dose is proportionately adjusted and the implantation repeated until a dose is determined that gives the desired concentration. In performing the measurement, it is important to measure the carbon atom concentration in the very near surface levels, for example in the most shallow 20 or 50 angstroms. Secondary ion mass spectroscopy (SIMS) is normally employed to measure atomic concentrations resulting from ion implantation, but other appropriate techniques may be employed. In effecting the method of this invention, accurate technique must be employed to assure that a representative result is achieved for the very near surface depths on the order of 20 or 50 angstroms. It is desirable to use oxygen-leak SIMS techniques or quadrupole SIMS techniques, both of which are known in the art to produce superior measurements of atomic concentrations in very shallow depths.

A second method utilized would be to estimate the near-surface concentration of carbon atoms that will result from a preselected implantation dose by a simulation technique. The computer simulation package SRIM-2000 (SRIM-2000 results from the work of J. P. Biersack and J. F. Ziegler. Information and download of the code is available on the World Wide Web at the address http://www.research.ibm.com/ionbeams/SRIM/SRIMA.HTM) includes a computer code called TRIM for monte-carlo simulation of implantation concentration distributions in most materials and may be employed to estimate the surface concentration of carbon resulting from implantation of carbon ions into the materials of interest for this invention. The substrate material is specified to the computer code by the user as are the implantation ion and conditions. The simulation code provides various information including estimated depth distribution data for the implanted ions in units of (atoms/cm$^3$)/(ions/cm$^2$). A simple arithmetic ratio can then give the required implantation dose in ions/cm$^2$ to achieve a desired atoms/cm$^3$ concentration. The code also outputs tables of stopping depths for the implanted ions that can be used to construct depth distribution curves for the implantation using ordinary histogram techniques.

FIG. 1 shows the result of using the TRIM code to produce an example depth distribution curve for implantation of a dose of $2.31 \times 10^{15}$ carbon ions/cm$^2$ at 35 keV into a cobalt substrate having a density of 8.9 g/cm$^3$. It shows that the resulting average near-surface (0 to 20 angstroms depth) concentration is $4 \times 10^{19}$ for the $2.31 \times 10^{15}$ ions/cm$^2$ implantation dose.

Figure 2:
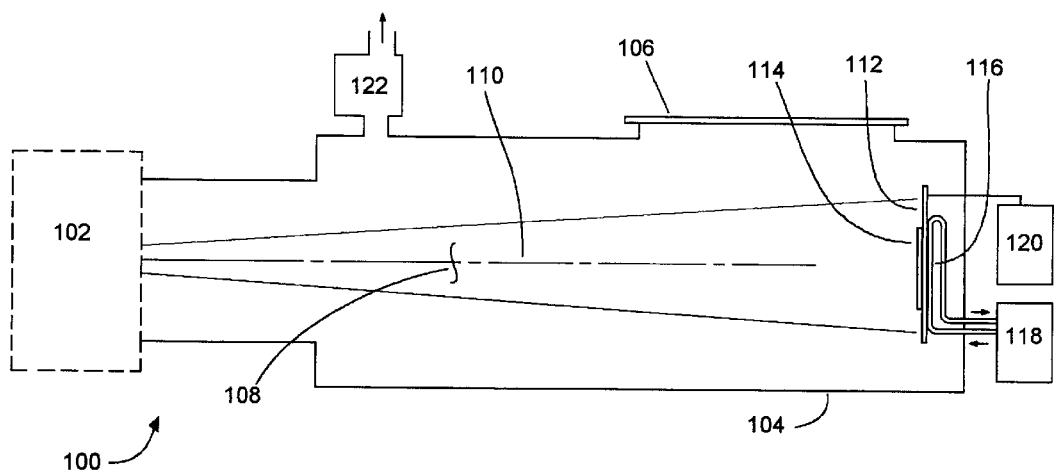
FIG. 2 schematically illustrates the carbon ion implanter of this invention for implanting a workpiece prior to DLC film deposition.

The process of this invention can be performed by a number of different conventional ion implanters which have been modified within the context of this invention to form the specific ion implanter shown and described herein. For example, within this invention, a Varian model DF4/3000 medium current implanter having its end station modified to accept workpiece substrates of a variety of different shapes is acceptable. It should further be recognized that many other models of commercially available ion implanters are also suitable for performing the implantation, provided they have processing chambers adapted to, or that can be adapted to, suitably disposing the workpieces in the path of the irradiating carbon ion beam as required by the present inventive concept. FIG. 2 shows the use of the implanter with a modified end station to implant a workpiece with carbon ions prior to DLC film deposition.

More specifically, FIG. 2 shows an ion implantation system 100 for pre-deposition carbon ion implantation for improving the adhesion properties of a DLC film to be deposited on a substrate according to the method of the invention. For example, a Varian model DF4/3000 ion implanter 102, having a modified end station process chamber 104 provides a scanned carbon ion beam 108. Ion implanter 102 has a beam mass analyzer, and is capable of providing a pure carbon ion beam 108 having a beam energy that is adjustable up to as much as 200 keV. Ion beam 108 has a central axis 110 which is directed at a surface of workpiece 114 disposed in the path of the ion beam 108 for processing according to the method of the invention. Workpiece 114 is held by workpiece holder 112. Workpiece holder 112 also functions as an ion beam charge collector, collecting the electrical charge of the ions in the scanned ion beam 108. The ion beam 108 is scanned across a predetermined area on the surface of workpiece holder 112, the area including the area containing the workpiece 114. The ion current collected by the workpiece holder flows into current integrator/processor 120, which integrates the total current and calculates and displays the total dose, in ions/cm$^2$, that are irradiated onto the workpiece. Ion implanter 102 has means for starting and stopping the ion beam 108, and in conjunction with current integrator/processor 120 is operable to deliver a predetermined dose to the workpiece 114. Since the ion beam irradiation of the workpiece 114 may induce heating, and since such heating may be undesirable, a cooling loop 116 is thermally connected to workpiece holder 112 to remove heat from a workpiece 114 in thermal contact with workpiece holder 112. Conventional chiller/circulator 118 is operable to circulate chilled cooling fluid through cooling loop 116 to remove heat from the workpiece and workpiece holder when desired. A vacuum pumping system 122 maintains the end station process chamber at a vacuum reduced pressure during processing. An access plate 106 in the end station process chamber 104 may be removed to change workpieces or may be hermetically sealed to permit the maintenance of vacuum conditions in the end station process chamber 104.

Following carbon implantation, a subsequent process, which may be a conventional CVD, PVD, PLD, IBAD, or GCIBAD process for depositing a DLC film of desired thickness, is used to apply the hard, friction and wear reducing coating. The film thus applied has improved adhesion over that obtained without the pre-deposition adhesion enhancement. Another aspect of the present invention and the most desirable process for depositing a DLC film is a non-conventional IBAD processes which deposits the DLC film under low temperature conditions.

The IBAD DLC deposition process of the present invention produces an exceptionally smooth and uniform DLC coating. The coating improves many surface characteristics including hardness, wear resistance, and coefficient of friction. This deposited film is chemically inert and has excellent adhesion properties. This extremely low stress deposition process which allows films to be deposited to thicknesses of many microns, if required, is described below.

When used in combination with the aforementioned pre-deposition carbon implantation process, the DLC film deposition process of the present invention is capable of producing DLC films that are strongly adhered to substrates, particularly materials that do not readily form strong carbide bonds at low temperatures. The DLC deposition and the pre-deposition carbon implantation process can both be performed at temperatures below 100° C. with good results, and so are applicable to situations wherein it is desirable to limit temperature excursions of the substrates and films. This preferred method of applying the DLC film is by argon IBAD of carbonaceous vapor, in which the argon ion beam transforms deposited carbonaceous vapor into DLC, and will be described more fully herein. The carbonaceous vapor is generated by thermal sublimation in a sublimation oven of a fullerene or of carbon nano-tubules. When a fullerene is used, any of the various carbon fullerenes may be used, such as $C_{60}$ or $C_{70}$. $C_{60}$ is the preferred fullerene. When the fullerene $C_{60}$ is used, then an appropriate sublimation oven temperature is 550–580° C. By using a high carbon-purity source material, it is possible to avoid the introduction of unwanted contaminants that may be less desirable than carbon.

Figure 3:
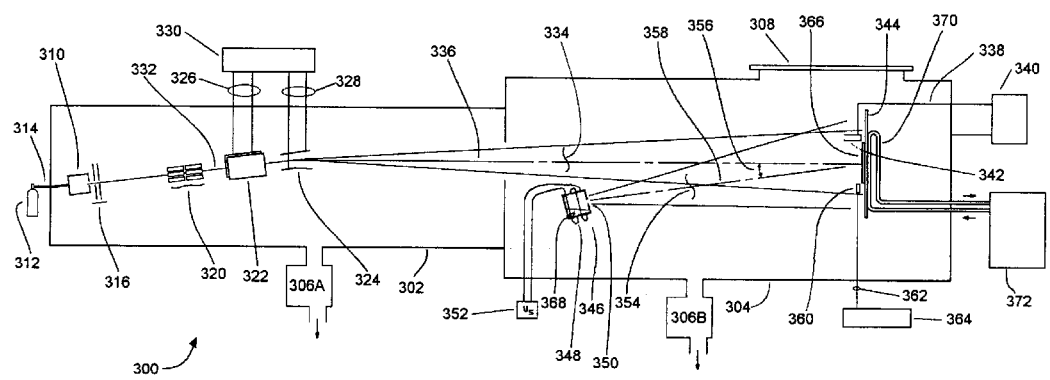
FIG. 3 schematically illustrates ion beam assisted deposition upon a workpiece of diamond-like carbon film by the invention.

FIG. 3 shows IBAD system 300 for depositing a DLC film on a workpiece substrate 366. The apparatus includes a vacuum vessel consisting of two chambers. An ion beam generation chamber 302 communicates with deposition chamber 304. The two chambers of the vacuum vessel are maintained under reduced pressure vacuum conditions by vacuum pump systems 306A and 306B. Ion beam generation is performed as follows: a gas bottle 312 contains a source feed gas which is preferably, but not necessarily, argon. Argon is delivered from the gas bottle 312 to a Freeman-type ion source 310 or the like by a gas feed tube 314. Beam forming high voltage electrodes 316 extract, focus and accelerate an ion beam 332, which is preferably made up of argon ions. A quadrupole doublet lens 320 focuses ion beam 332 and a scanning system consisting of two orthogonally oriented pairs of electrostatic scan plates 322 and 324, which scan the ion beam into a rectangular scanned beam 334, having a central beam axis 336 directed toward workpiece 366. A high voltage scan signal generator 330 delivers scanning voltage waveforms to scan plate pairs 322 and 324 by means of cables 326 and 328 respectively. Scan signal generator 330 also superimposes a DC voltage on the scan voltages at scan plates 324 to introduce a deflection in the ion beam central trajectory in the region between scan plates 324 in order to separate any undesirable uncharged atoms from the scanned ion beam 334.

Deposition chamber 304 has an access plate 308, which may be removed to facilitate inserting or removing workpiece 366 to or from the apparatus. When closed, access plate 308 seals hermetically, to facilitate the maintenance of vacuum conditions within the process chamber. The workpiece is held by workpiece holder 344, which disposes the workpiece in the paths of ion beam 334 and deposition vapor 354. Deposition vapor 354 has a central axis 358 directed at workpiece 366 and is produced by sublimation oven 346. Oven 346 has an electrical heating coil 348 which receives electrical power from sublimation oven power supply 352, which is adjustable so as to permit operation of the sublimation oven 346 over a range of temperatures from room temperature to 800° C. The sublimation oven is filled with a charge 368 of vaporizable carbonaceous feed material consisting of a fullerene or carbon nano-tubules, high purity $C_{60}$ is the preferred material for the charge 368. When $C_{60}$ is used, the appropriate temperature for the sublimation oven 346 is in the approximate temperature range of 550 to 580° C. Under such conditions, the sublimation oven 346 produces carbonaceous vapor 354 at a rate suitable for depositing DLC films at the rate of approximately 1 to 1.5 angstroms per second. The sublimation oven is disposed so that the central axis 358 of the deposition vapor plume is at an angle 356 with respect to the central axis 336 of the ion beam 334. The angle 356 is preferably in the range from 20° to 50°.

A Faraday cup 342 collects a sample of the ion beam current which is conducted to beam current monitor/integrator 340 via cable 338. Beam current monitor/integrator 340 displays the instantaneous beam current and the integrated dose (ions $cm^2$) that has been irradiated to the workpiece 366 and workpiece holder 344. A crystal deposition rate sensor 360 is connected via cable 362 to an Inficon model XTM/2 commercial deposition monitor 364 for measuring and displaying the deposition rate of DLC film. Since the ion beam irradiation of the workpiece 366 may induce heating, and since such heating may be undesirable, a cooling loop 370 is thermally connected to workpiece holder 344 to remove heat from a workpiece 366 in thermal contact with workpiece holder 344. Conventional chiller/circulator 372 is operable to circulate chilled cooling fluid through cooling loop 370 to remove heat from the workpiece and workpiece holder when desired.

In the deposition process, the argon ion beam is operated with a preferred beam energy of 20 to 50 keV, with 35 keV being considered an optimal value. The temperature of the sublimation oven 346 is adjusted so that the deposition rate indicated by the deposition monitor 364 is from 0.75 to 1.5 angstroms/sec. The argon beam current is adjusted so that the ion flux density is in the range of $1 \times 10^{14}$ to $1.4 \times 10^{14}$ ions/$cm^2$-sec per angstrom/sec deposition rate, with $1.2 \times 10^{14}$ ions/$cm^2$-sec per angstrom/sec deposition rate being the preferred value. Using these conditions, the carbonaceous vapor and argon beam are continuously co-deposited until the desired thickness of DLC film is reached as indicated by the deposition monitor 364.

Although the apparatuses described above for performing the pre-deposition carbon implantation and the DLC film deposition are shown as comprising only a single workpiece at a time and must be manually loaded and unloaded, it is possible that the addition of load locks, automatic beam gates, and mechanized handling systems with suitable automatic controls can facilitate the continuous flow processing of workpieces for either the carbon implantation portion of the process or the DLC film deposition portion of the process.

Figure 4:
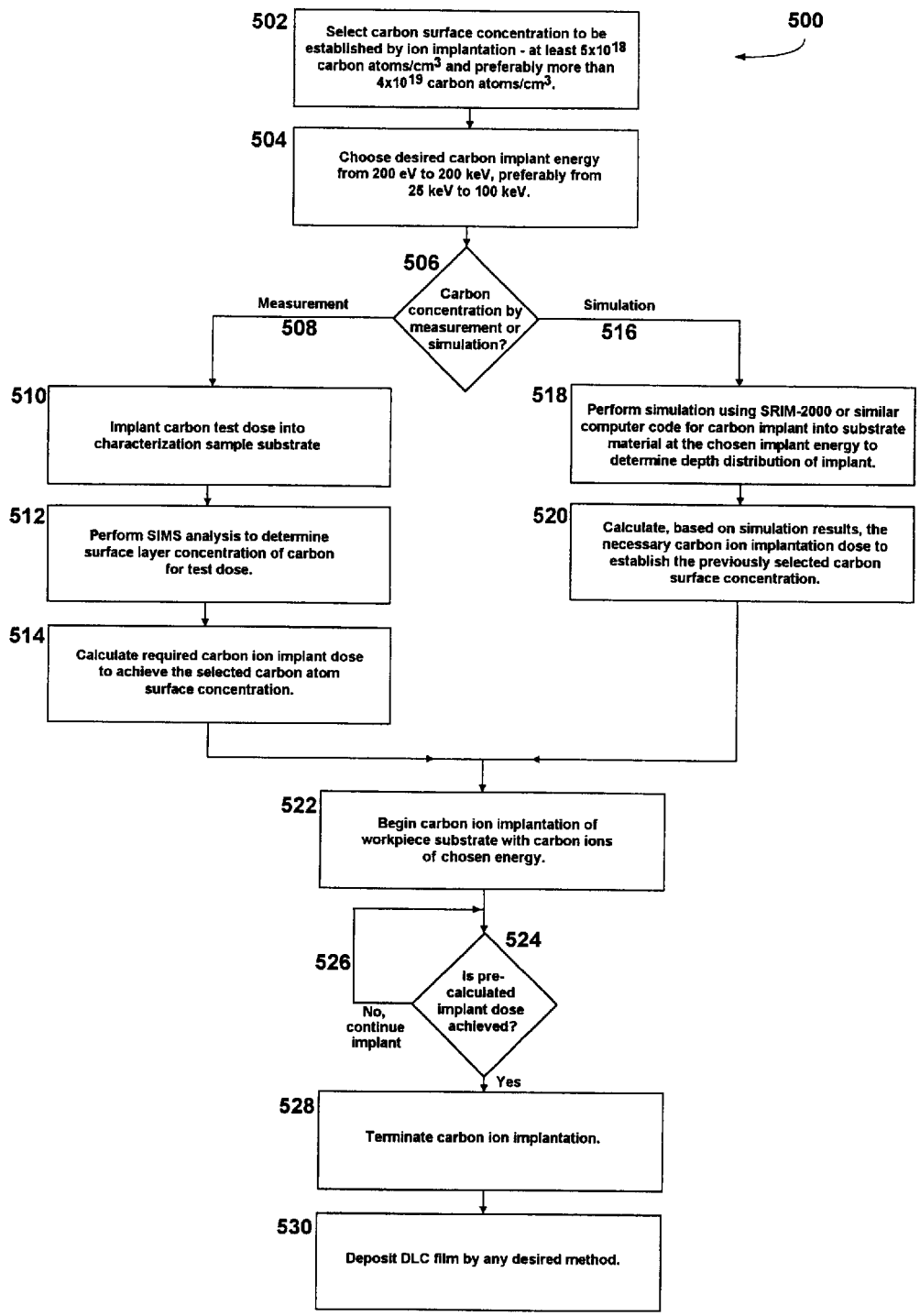
FIG. 4 is a flowchart of the DLC film adhesion enhancement method of the present invention.

FIG. 4 is a flowchart 500 that diagrams the steps of the method of the invention for producing a strongly adhered DLC coating for substrates. In step 502 it is first determined what carbon concentration is to be established near the surface of the substrate upon which it is desired to deposit an adherent DLC film coat. To effectively practice the invention, the carbon concentration near the surface must be at least $5 \times 10^{18}$ carbon atoms/$cm^3$ and preferably is $4 \times 10^{19}$ carbon atoms/$cm^3$ or more. Higher concentrations require longer ion implantation times to achieve but provide more opportunities for carbon-carbon bonds between the substrate and the DLC film. In step 503 the energy at which the carbon ions will be implanted is chosen. To practice the invention, the carbon ion energy should preferably be between 200 eV and 100 keV per ion and optimally is between 25 keV and 100 keV per ion. Factors that may affect the selection of the carbon implantation energy are the energy range readily available from the ion implantation apparatus that is employed and the relationship between available carbon ion beam current versus energy for the ion implantation apparatus employed. Furthermore the selection of carbon concentration and carbon ion energy determine the total energy transferred to the substrate by the implantation process and thus affects the amount of substrate heating that may occur. If maintaining a low substrate temperature is a desirable goal for the process, lower ion energies may be chosen if substrate cooling measures are inadequate to limit the temperature. After the desired carbon concentration and ion implantation energy have been determined, a decision step 506 is used to decide whether the requisite ion implantation dose will be determined by measurement (path 508) or by simulation or modeling (path 514). This decision may be based on considerations of the availability of the means of measurement or simulation and on consideration of the tradeoff between the generally greater cost and precision of the measurement method compared to the possibly lower cost and precision of the simulation method. When it is decided to determine the carbon ion implantation dose by measurement, path 508 consisting of steps 510, 512, and 514 is taken. When it is decided to determine the carbon ion implantation dose by simulation or modeling, path 516 comprising of steps 518 and 520 is taken.

In the simulation path 516, the step 518 includes performing a simulation of the carbon ion implantation using a suitable conventional computer code for estimating the resulting near-surface carbon atom concentration for a particular carbon ion implantation dose. In general, such simulation requires specifying the characteristics of the substrate and the conditions of the carbon ion implantation. Of course there are many known methods of simulating or modeling the resulting concentration distribution for an ion implantation process, but one computer code that has been found to work satisfactorily is the TRIM module of the SRIM-2000 computer code package. The substrate material data is specified to the computer code by the user as are the implantation ion species and energy. The simulation code provides various information including estimated depth distribution data, c(d)=carbon atomic concentration as a function of depth, for the implanted ions in units of (atoms/$cm^3$)/(ions/$cm^2$).

After simulation, in step 520 the required implantation dose in ions/$cm^2$ to achieve the desired atoms/$cm^3$ concentration near the surface of the substrate is determined by dividing the desired carbon atom concentration near the surface by the simulation result for c(d) at the depth, d, of interest. In this case, the near-surface carbon concentration is of interest and d is selected to represent the shallowest 20 or 50 (for example) angstroms of the substrate. The resulting value is the simulated estimate of the required carbon ion implantation dose, D, in ions/cm$^2$ to achieve the desired near-surface carbon atom concentration.

In the measurement path 508, the step 510 comprises performing a test carbon ion implantation into a characterization substrate of the same material as that upon which it is desired to deposit an adherent DLC film. The test implantation is done using carbon ions at the previously (step 504) chosen energy and with a dose estimated to yield approximately the desired near surface concentration of carbon atoms. The test dose can be estimated by simulation as described for steps 518 and 520 as discussed heretofore, or by other well known methods for estimation. Following implantation of the test dose, a characterization step 512 measures the resulting surface concentration. In performing this measurement, it is important to measure the carbon atom concentration in the very near-surface levels, for example in the shallowest 20 or 50 angstroms. Secondary ion mass spectroscopy (SIMS) is normally employed to measure atomic concentrations resulting from ion implantation. Accurate techniques must be employed to assure that a representative result is achieved for the very near surface depths on the order of 20 or 50 angstroms. It is desirable to use oxygen-leak SIMS techniques or quadrupole SIMS techniques, both of which are known in the art to produce superior measurements of atomic concentrations in very shallow depths. Once the near-surface concentration of the carbon atoms in the characterization sample has been measured, the required carbon ion implantation dose is calculated in step 514. If the concentration measured in the near-surface region of the test sample is too high or too low, the test implantation dose is proportionately adjusted to yield an ion implantation dose, D, that will give the desired near-surface carbon atom concentration.

After the required carbon ion implantation dose, D, has been determined, the workpiece upon which the DLC film is to be deposited is placed into a suitable ion implantation such as system 100 shown in FIG. 2 or any other ion implantation system capable of providing the required carbon ion dose at the required energy. Step 522 represents implanting the workpiece substrate with carbon ions of the predetermined energy. As the carbon implantation continues, it is monitored in decision step 524 to determine whether the required dose, D, has been achieved. Until the required dose, D, is achieved, path 526 is followed, continuing the implantation until the required dose has been achieved. Then step 528 terminates the process of carbon ion implantation. At this step the near-surface carbon atom concentration selected in step 502 has been established in the workpiece substrate. In step 530, the workpiece substrate, having been pre-processed to provide enhanced adhesion receives a deposited DLC film. The deposition of the DLC film or coating may be applied by any of the conventional methods: chemical vapor deposition (CVD), physical vapor deposition (PVD), pulsed laser deposition (PLD), conventional ion beam assisted deposition (IBAD), or gas cluster ion beam assisted deposition (GCIBAD), all of which will produce DLC films that are strongly adherent to the workpiece substrate.

Figure 5:
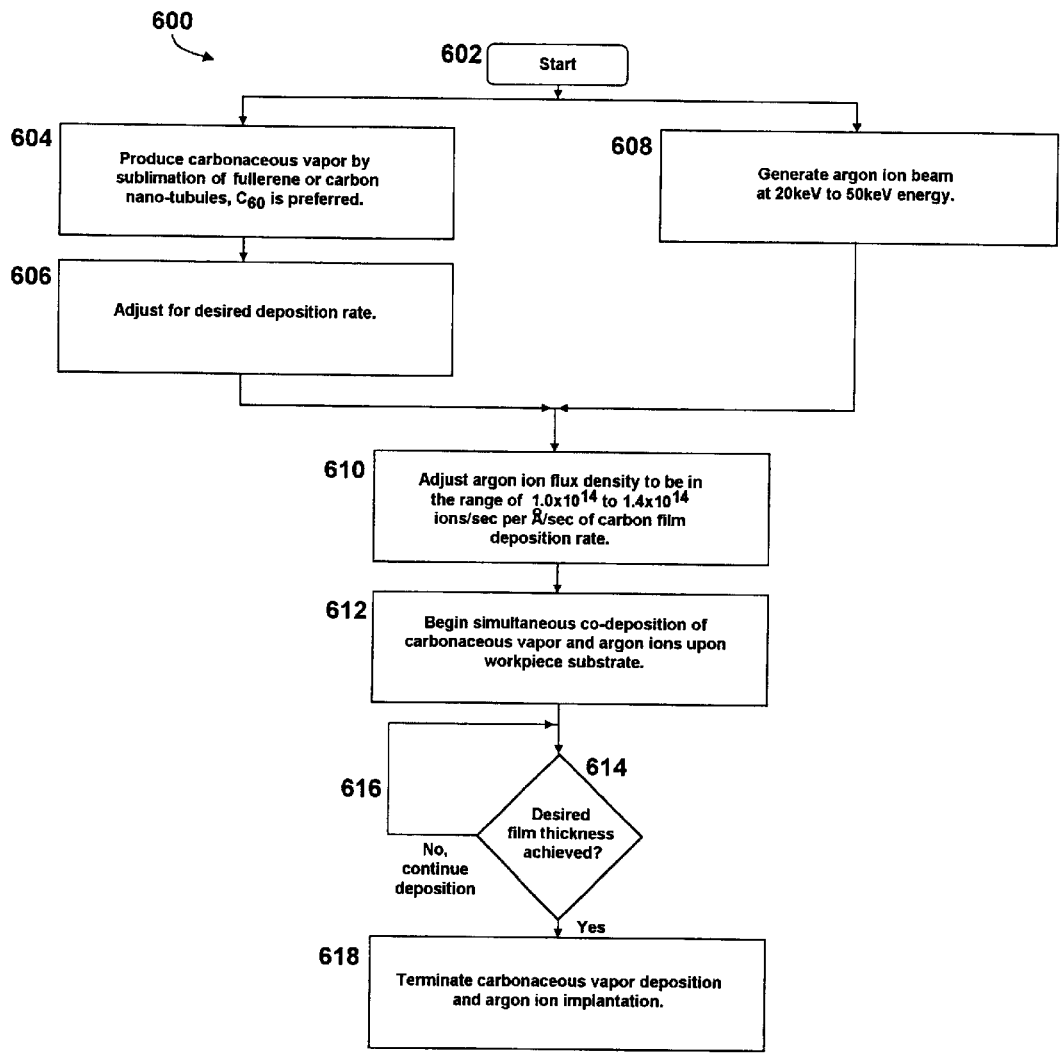
FIG. 5 is a flowchart of the preferred method of this invention for DLC film deposition.

A preferred method for DLC deposition in step 530 of FIG. 4 is shown in greater detail. in process flow chart 600 shown in FIG. 5. The preferred method for DLC deposition is an unconventional method of ion beam assisted deposition (IBAD) and is accomplished in a IBAD system 300 as shown in FIG. 3 or in a similar IBAD system having elements for simultaneously irradiating the workpiece sample with carbonaceous vapors and energetic ions. At the start 602 of the process, a carbonaceous vapor and an ion beam are prepared according to steps 604 606 and 608. At step 604 a carbonaceous vapor is produced by the use of an oven to sublimate a carbonaceous solid source material that consists of a vaporizable fullerene or carbon nano-tubules. The fullerene, $C_{60}$, is the preferred source material. The resulting flow of carbonaceous vapor is adjusted in step 606 by adjusting the temperature of the sublimation oven. When $C_{60}$ is used, the appropriate temperature for the sublimation oven is in the approximate temperature range of 550 to 580° C. By adjusting the temperature, a deposition rate of from approximately 1.0 to 1.5 angstroms per second can be selected.

In addition to the carbonaceous vapor, an adjustable ion beam is prepared in step 608. The ion beam is preferably composed of argon ions having an energy of between 20 keV and 50 keV. At step 610, following preparation of the carbonaceous vapor and the ion beam, the ion beam flux density is adjusted to be in the range of $1.0 \times 10^{14}$ to $1.4 \times 10^{14}$ ions/cm$^2$-sec per angstrom/sec of carbon film deposition rate as previously established in step 606. When the carbonaceous vapor film deposition rate and the ion beam flux density have both been set, step 612 begins the simultaneous co-deposition of carbonaceous vapor and ions (preferably argon ions) upon the workpiece substrate. As the DLC film deposition continues, it is monitored in decision step 614 to determine whether the desired DLC film thickness has been achieved. Until the desired DLC film thickness is achieved, path 616 is followed, continuing the deposition process until the required thickness has been achieved. Then step 618 terminates the DLC film deposition process.

The invention provides a method for producing a strongly adhered DLC coating for a substrate comprised of a metal or metal alloy that does not readily form carbides (for example chromium, cobalt, nickel, copper, and alloys thereof or predominately thereof) or a metal or metal alloy that may form carbides but is coated with an oxide coating that does not readily form bonds with carbon (for example titanium or analloy consisting primarily of titanium, but having an oxidized surface layer), It provides for improved adhesion of a DLC film to a substrate by using a pre-deposition implantation of carbon ions into the substrate. It does not require the deposition of intermediate layers nor the use of high ion beam energies in order to achieve thick DLC films, and so it is less costly than prior methods. The invention is readily applied to the low temperature formation of strongly adhered friction and wear resistant DLC layers on metallic substrates or oxides which do not readily form carbide bonds at low temperatures.

Although the invention has been described with respect to various embodiments, it should be realized this invention is also capable of a wide variety of further and other embodiments within the spirit and scope of the appended claims.

What is claimed is:

1. A method for adhering a diamond-like carbon film to a surface of a substrate, comprising steps of:
    selecting a carbon atom concentration for said substrate adjacent to said surface greater than $5 \times 10^{18}$ carbon atoms per cubic centimeter;
    selecting a thickness of the region adjacent to said surface extending from said surface to depth of up to 50 Angstroms for the selected carbon atom concentration,
    selecting a carbon ion implantation energy;
    determining a carbon ion implantation dose for implanting carbon ions into said thickness of the region of said substrate adjacent to said surface;

implanting said region of said substrate adjacent to said surface with said carbon ions by an ion implantation process of ionizing a source of carbon and driving the carbon ions into the region at the selected energy and determined dose to form said selected carbon atom concentration in the selected thickness of said region adjacent to said surface; and depositing a source carbon on the ion implanted surface of the substrate to form a diamond-like carbon film on said ion implanted surface of said substrate of high carbon purity.

2. The method of claim 1, wherein said determining step further comprises the steps of:

implanting, at said selected carbon ion implantation energy, a carbon ion test dose into another substantially similar substrate;

determining a carbon atom concentration adjacent the surface of said another substantially similar substrate said test dose; and calculating, based on said determined carbon atom concentration, said carbon ion implantation dose required to achieve said selected carbon atom concentration adjacent said surface of said substrate.

3. The method of claim 1, wherein said determining step further comprises steps of:

simulating, through use of a mathematical model, a carbon ion implantation into said substrate at said selected carbon ion implantation energy;

determining a carbon depth profile for said simulated carbon ion implantation; and calculating, based on said carbon depth profile, the required carbon ion implantation dose to achieve said selected carbon atom concentration adjacent said surface of said substrate.

4. The method of claim 1, wherein said selected carbon atom concentration is greater than $4 \times 10^{19}$ carbon atoms per cubic centimeter.

5. The method of claim 3, wherein said selected carbon atom concentration is selected to be substantially equivalent to the mean volume concentration of carbon atoms within 50 Angstroms adjacent said surface of said substrate in said simulated carbon ion implantation.

6. The method of claim 1, wherein said selected carbon ion implantation energy is in the range of approximately 1 keV to approximately 200 keV.

7. The method of claim 1, wherein said depositing step comprises depositing a carbonaceous vapor by ion beam assisted deposition.

8. The method of claim 1, wherein said substrate comprises a metal.

9. The method of claim 1, wherein said substrate comprises a metal alloy.

10. The method or claim 1, wherein said substrate comprises a metal that does not readily form carbides.

11. The method of claim 1, wherein said substrate comprises a metal alloy that does not readily form carbides.

12. The method of claim 1, wherein said substrate comprises of a group consisting of the following: chromium, cobalt, nickel, copper, or an alloy that comprises any of chromium, cobalt, nickel, or copper.

13. The method of claim 1, wherein said substrate comprises a metal having an oxide coating that does not readily form bonds with carbon.

14. The method of claim 1, wherein said substrate comprises a metal alloy having an oxide coating that does not readily form bonds with carbon.

15. The method of claim 1, wherein said substrate comprises titanium having an oxidized surface layer.

16. The method of claim 1, wherein said substrate comprises an alloy of primarily titanium having an oxidized surface layer.

17. The method of claim 1, wherein said implanting step further comprises the step of maintaining said substrate at a temperature of less than 300 degrees Celsius.

18. The method of claim 1, wherein said implanting step further comprises the step of maintaining the temperature of said substrate at less than 50 degrees Celsius.

19. The method of claim 1, wherein said selected carbon ion implantation energy is in the range from approximately 25 keV to approximately 100 keV.

20. A method of depositing a diamond-like carbon film on a surface of a substrate comprising the steps of:

producing a carbonaceous vapor from a solid carbonaceous source material;

setting a rate for deposition of said carbonaceous vapor on said surface in the range of approximately 0.75 to 1.5 Angstroms per second;

generating an ion beam of an inert gas having a flux density and having a beam energy of from approximately 20 keV to approximately 50 kev;

directing said ion beam at said surface for assisting formation of a high purity diamond-like carbon film by deposition of the carbonaceous vapor;

depositing said carbonaceous vapor on said surface simultaneously with said directing of said ion beam at said surface;

monitoring growth of a thickness of said diamond-like carbon film on said substrate; and terminating said carbonaceous vapor deposition when said diamond-like carbon film reaches a predetermined thickness.

21. The method of claim 20, wherein said ion beam is an argon ion beam.

22. The method of claim 20, wherein said inert gas ion beam is an argon ion beam.

23. The method of claim 20, wherein said carbonaceous source material comprises a vaporizable fullerene.

24. The method of claim 20, wherein said carbonaceous source material comprises carbon nano-tubules.

25. The method of claim 23, wherein said vaporizable fullerene comprises $C_{60}$.

26. The method of claim 20, wherein said ion beam flux density is in the range of from approximately $1.0 \times 10^{14}$ to approximately $1.4 \times 10^{14}$ (ions/cm$^2$-second) per (angstrom/second) of said deposition rate.

27. A method for adhering a diamond-like carbon film to a surface of a substrate, comprising steps of:

selecting a carbon atom concentration of at least $5 \times 10^{18}$ atoms/cc to be established in a pre-selected shallow surface portion of the substrate of up to 50 angstroms depth by ion implantation;

selecting a depth of such shallow portion of the selected carbon concentration;

selecting a carbon ion implantation energy;

determining a carbon ion implantation dose for implanting said selected carbon atom concentration adjacent said surface of said substrate;

generating a first ion beam comprising carbon ions having said selected carbon ion implantation energy and said determined dose;

implanting said surface portion with carbon ions to the selected carbon atom concentration at the selected depth adjacent said surface;

producing a carbonaceous vapor from a solid carbonaceous source material;

setting a rate for deposition of said carbonaceous vapor to a predetermined deposition rate value;

generating a second ion beam;

directing said second ion beam at said surface for assisting formation of a high purity diamond-like carbon film on said surface;

depositing said carbonaceous vapor at said rate on said surface simultaneously with said directing of said second ion beam at said surface;

monitoring growth of a thickness of said diamond-like carbon film; and terminating said carbonaceous vapor deposition when said diamond-like carbon film reaches a predetermined thickness.

28. A method for adhering a diamond-like carbon film to a surface of a substrate wherein said diamond-like carbon film does not contain hydrogen, comprising the steps of:

introducing by carbon ion implantation employing energies in the range of approximately 1 keV to approximately 200 keV a selected volume concentration of carbon atoms within the region of said substrate adjacent said surface; and depositing the diamond-like carbon film on said surface of said substrate.

29. The method of claim 28, wherein said carbon ion implantation results in a mean volume concentration of carbon atoms adjacent said surface of at least $5 \times 10^{18}$ carbon atoms per cubic centimeter, and wherein said shallow portion depth is up to 20 angstroms.

30. A method for adhering a diamond-like carbon film to a surface of a substrate, comprising steps of:

selecting a carbon atom concentration for the region of said substrate on or adjacent to said surface greater than $5 \times 10^{18}$ carbon atoms per cubic centimeter;

selecting a thickness of the region on or adjacent to said surface extending from the surface to a depth of up to 50 Angstroms for the selected carbon concentration;

selecting a carbon ion implantation energy;

determining a carbon ion implantation dose for implanting carbon ions to obtain said selected carbon atom concentration;

implanting said surface with said carbon ions at the selected dose and energy to form said selected carbon atom concentration in said selected thickness of the region on or adjacent to said surface; and depositing the diamond-like carbon film on said ion implanted surface of said substrate through ion beam assisted deposition.

31. A method for adhering a diamond-like carbon film to a surface of a substrate, comprising steps of:

selecting a carbon atom concentration for a region of said substrate on or adjacent to said surface greater than $5 \times 100^{18}$ carbon atoms per cubic centimeter;

selecting a thickness of the region on or adjacent to said surface extending from the surface to a depth of up to 50 Angstroms for the selected carbon concentration;

selecting a carbon ion implantation energy;

determining a carbon ion implantation dose for implanting carbon ions to obtain said selected carbon atom concentration;

providing a source of carbon ions;

implanting said surface with said carbon ions at said selected energy and dose at a temperature less than 100° C. forming said selected carbon atom concentration has been obtained to the selected depth; and depositing the diamond-like carbon film on said ion implanted surface of said substrate, wherein said implanting and said depositing are substantially performed at a temperature less than 100° C.;

the selected depth ion implantation at the selected concentration being up to 50 angstroms.

32. A method of depositing a diamond-like carbon film on a surface of a substrate having a pre-implanted concentration of carbon, comprising the steps of:

producing a carbonaceous vapor from a solid carbonaceous source material;

setting a rate for deposition of said carbonaceous vapor on said surface to a predetermined deposition rate value in the range of approximately 0.75 to 1.5 Angstroms per second;

generating an ion beam from inert gas and having a beam energy of from approximately 20 keV to approximately 50 keV;

directing said ion beam at said surface for assisting formation of said diamond-like carbon film;

depositing said carbonaceous vapor at said rate on said surface simultaneously with said directing of said ion beam at said surface;

monitoring growth of a thickness of said diamond-like carbon film on said substrate; and terminating said carbonaceous vapor deposition when said diamond-like carbon film reaches a predetermined thickness.

* * * * *